United States Patent
Light

(10) Patent No.: US 11,195,838 B2
(45) Date of Patent: Dec. 7, 2021

(54) ARRAYS OF CAPACITORS, METHODS USED IN FORMING INTEGRATED CIRCUITRY, AND METHODS USED IN FORMING AN ARRAY OF CAPACITORS

(71) Applicant: Micron Technology, Inc., Boise, ID (US)

(72) Inventor: Scott L. Light, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 399 days.

(21) Appl. No.: 16/420,582

(22) Filed: May 23, 2019

(65) Prior Publication Data

US 2020/0373303 A1 Nov. 26, 2020

(51) Int. Cl.
*H01L 27/108* (2006.01)
*H01L 27/11502* (2017.01)
*H01L 49/02* (2006.01)

(52) U.S. Cl.
CPC ...... *H01L 27/1087* (2013.01); *H01L 27/1085* (2013.01); *H01L 27/10805* (2013.01); *H01L 27/10817* (2013.01); *H01L 27/10829* (2013.01); *H01L 27/10847* (2013.01); *H01L 27/11502* (2013.01); *H01L 28/86* (2013.01); *H01L 28/87* (2013.01); *H01L 28/88* (2013.01)

(58) Field of Classification Search
CPC ......... H01L 27/10805; H01L 27/10808; H01L 27/10817; H01L 27/10847; H01L 27/1085; H01L 27/10852; H01L 28/86; H01L 28/87; H01L 28/88
See application file for complete search history.

(56) References Cited

U.S. PATENT DOCUMENTS

| 2014/0145303 | A1* | 5/2014 | Kim | H01L 27/10808 257/532 |
| 2014/0154863 | A1* | 6/2014 | Seo | H01L 27/10814 438/386 |
| 2016/0064277 | A1* | 3/2016 | Park | H01L 27/10814 438/386 |

* cited by examiner

*Primary Examiner* — Marcos D. Pizarro
(74) *Attorney, Agent, or Firm* — Wells St. John P.S.

(57) ABSTRACT

A method used in forming integrated circuitry comprises forming an array of structures elevationally through a stack comprising first and second materials. The structures project vertically relative to an outermost portion of the first material. Energy is directed onto vertically-projecting portions of the structures and onto the second material in a direction that is angled from vertical and that is along a straight line between immediately-adjacent of the structures to form openings into the second material that are individually between the immediately-adjacent structures along the straight line. Other embodiments, including structure independent of method, are disclosed.

22 Claims, 10 Drawing Sheets

US 11,195,838 B2

ARRAYS OF CAPACITORS, METHODS USED IN FORMING INTEGRATED CIRCUITRY, AND METHODS USED IN FORMING AN ARRAY OF CAPACITORS

TECHNICAL FIELD

Embodiments disclosed herein pertain to arrays of capacitors, to methods used in forming integrated circuitry, and to methods used in forming an array of capacitors.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array and the wordlines may conductively interconnect memory cells along rows of the array. Each memory cell may be uniquely addressed through the combination of a digitline and a wordline.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is another type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile. Regardless, a typical goal in the fabrication of capacitors is to maximize surface area of the capacitor electrodes towards maximizing capacitance of the individual capacitors.

Capacitors and transistors may of course be used in integrated circuitry other than memory circuitry. Further, arrays of structures (circuit-operative or not) other than capacitors and/or transistors can be part of integrated

DETAILED DESCRIPTION OF EXAMPLE EMBODIMENTS

Embodiments of the invention encompass methods used in the fabrication of integrated circuitry and arrays of capacitors independent of method of manufacture. Integrated circuitry manufactured in accordance with method embodiments may have any of the attributes as described herein in structure embodiments. First example method embodiments are described with reference to FIGS. 1-14 in the fabrication of integrated circuitry comprising an array of capacitors.

Figure 1:
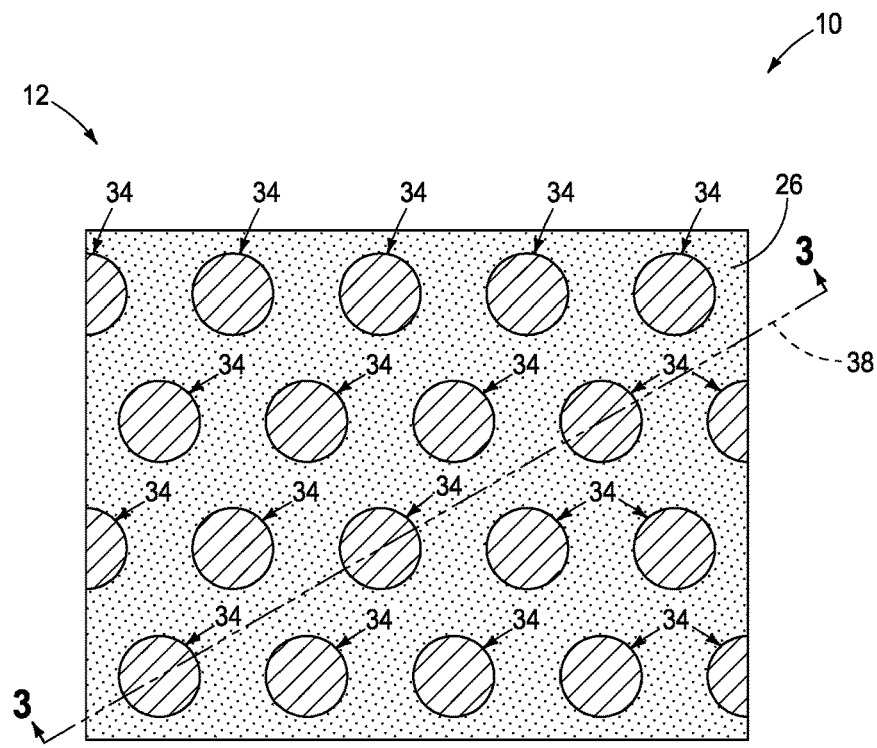
FIG. 1 is a diagrammatic cross-sectional view of a portion of a substrate construction in process in accordance with an embodiment of the invention and is taken through line 1-1 in FIG. 3.
Figure 2:
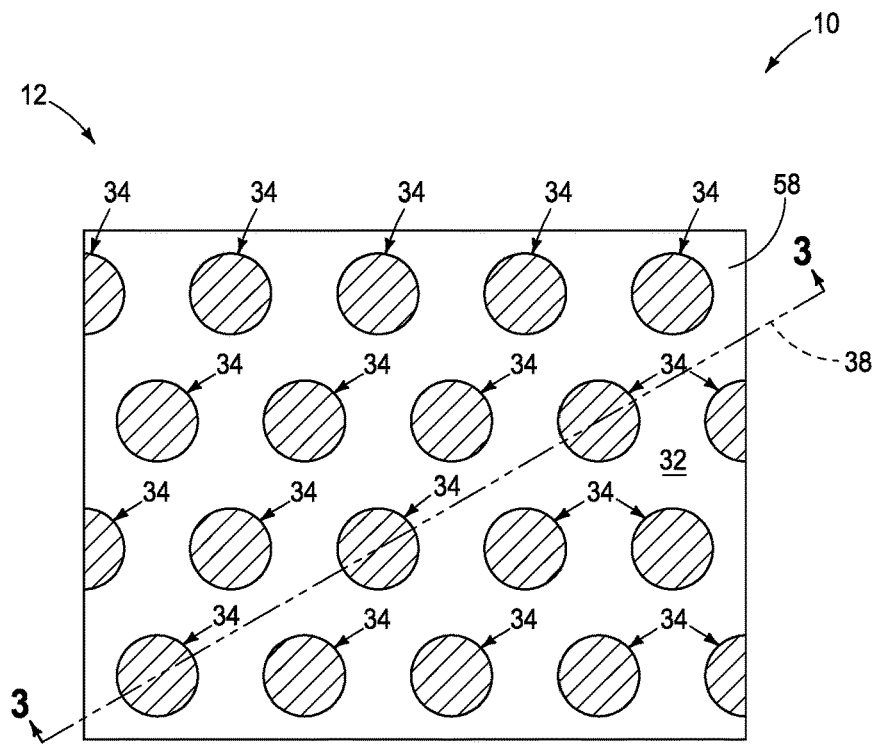
FIG. 2 is a diagrammatic cross-sectional view taken through line 2-2 in FIGS. 1 and 2.
Figure 3:
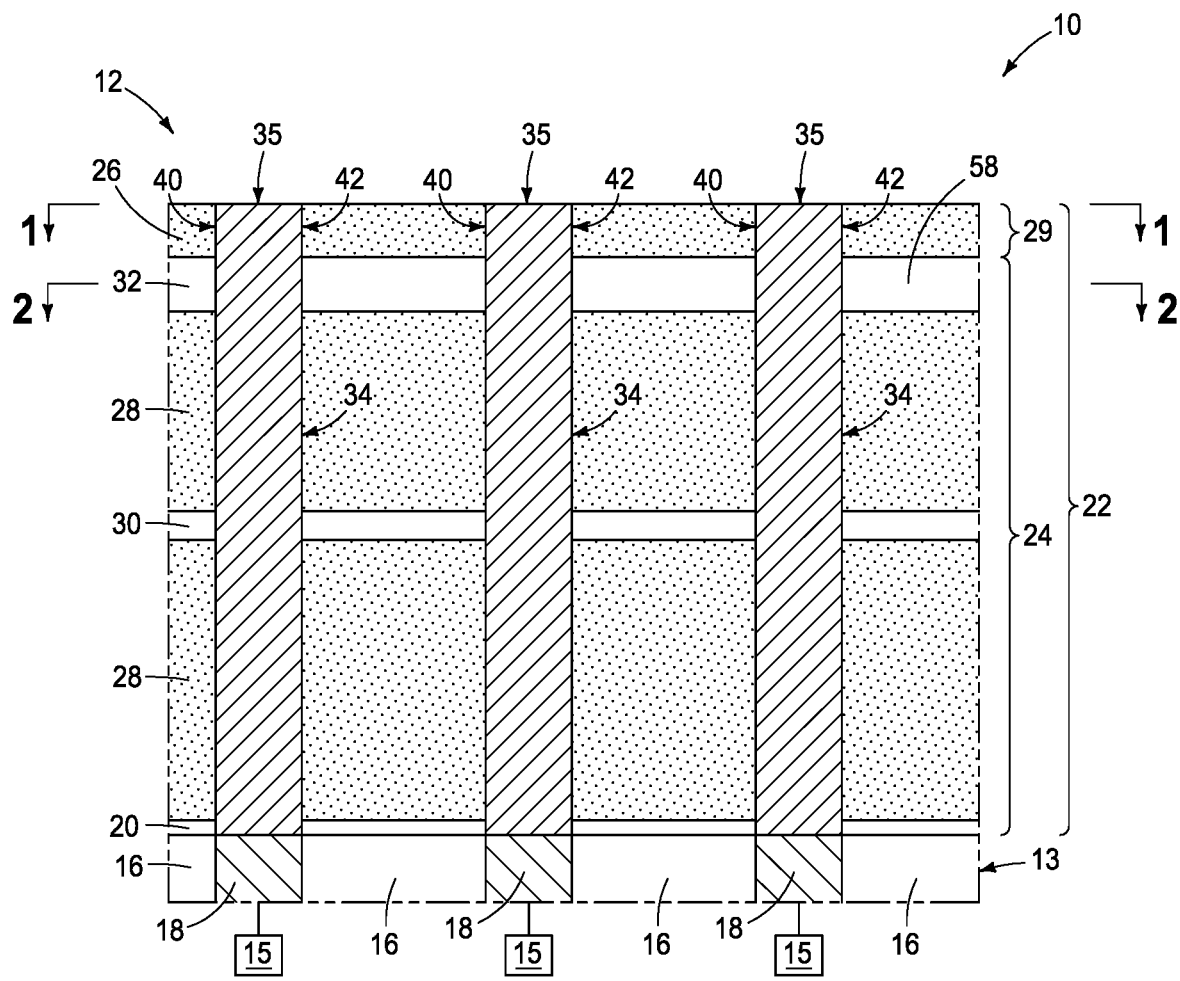
FIG. 3 is a diagrammatic cross-sectional view taken through line 3-3 in FIG. 3.

Referring to FIGS. 1-3, such show part of a construction 10 comprising an array or array area 12 in which capacitors will be fabricated. Construction 10 comprises a base substrate 13 having any one or more of conductive/conductor/conducting, semiconductive/semiconductor/semiconducting, or insulative/insulator/insulating (i.e., electrically herein) materials. Various materials have been formed elevationally over base substrate 13. Materials may be aside, elevationally inward, or elevationally outward of the FIGS. 1-3-depicted materials. For example, other partially or wholly fabricated components of integrated circuitry may be provided somewhere above, about, or within base substrate 13. Control and/or other peripheral circuitry for operating components within an array (e.g., a memory array) may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Access devices 15 are schematically shown in FIG. 3 and may be formed as part of base substrate 13. By way of example only, such may comprise field effect transistors for controlling access to individual capacitors, for example in DRAM circuitry where an access device 15 and a capacitor comprise components of a single memory cell (e.g., a one transistor, one capacitor [1T/1C] memory cell). However, other memory and non-memory circuitry are contemplated and whether existing or yet-to-be-developed. Example base substrate 13 is shown as comprising insulative material 16 (e.g., doped and/or undoped silicon dioxide) having conductive vias 18 extending there-through for electrically coupling an individual access device 15 to an individual capacitor.

A stack 22 has been formed vertically outward (e.g., above) of base substrate 13 and comprises first material 24 and second material 26 which in one embodiment and as shown is directly against first material 24. Example first material 24 comprises an insulative material 20 (e.g., silicon nitride and/or silicon oxynitride) that may have functioned as and/or will function as an etch-stop. Example first material 24 is also shown as comprising material 28 (e.g., doped or undoped silicon dioxide and which may be entirely sacrificial), intermediate material 30 (e.g., silicon nitride) as a horizontal layer within material 28, and a material 32 (e.g., silicon nitride) vertically outward of an upper portion of material 28. Example second materials 26 comprise silicon dioxide, spin-on carbon, silicon oxynitride, and existing or future-developed hard-masking materials. In the first-example-described embodiments, second material 26 may be sacrificial (e.g., all of it is ultimately removed at least within the array so that it does not comprise a part of the finished integrated circuitry construction).

An array of vertically-elongated first capacitor electrodes 34 has been formed through stack 22. Such may comprise a solid pillar construction as shown or may comprise any other suitable construction, for example being in the form of an upwardly-open container shape (not shown) that may or may not be filled with sacrificial material at this point in processing. An example first capacitor electrode material is titanium nitride. First capacitor electrodes 34 project vertically relative to an outermost portion of first material 24 (e.g., from at least an uppermost portion of example material 32), for example having some portion 29 thereof that so projects with an example vertical projecting distance of portion 29 being 10 to 15 nanometers.

Array 12 of first capacitor electrodes 34 may be considered as having respective straight lines 38 (one being so designated) that are between immediately-adjacent first capacitor electrodes 34, with construction 10 having respective vertical cross-sections that are along straight lines 38 (e.g., the vertical cross-section that is FIG. 3 with respect to the one designated straight line 38). Note that the respective straight lines 38 are not necessarily between immediately-most-proximate first capacitor electrodes 34 within array 12. Regardless, first capacitor electrodes 34 may be considered as having respective first sides 40 and respective second sides 42 in the vertical cross-section.

Figure 4:
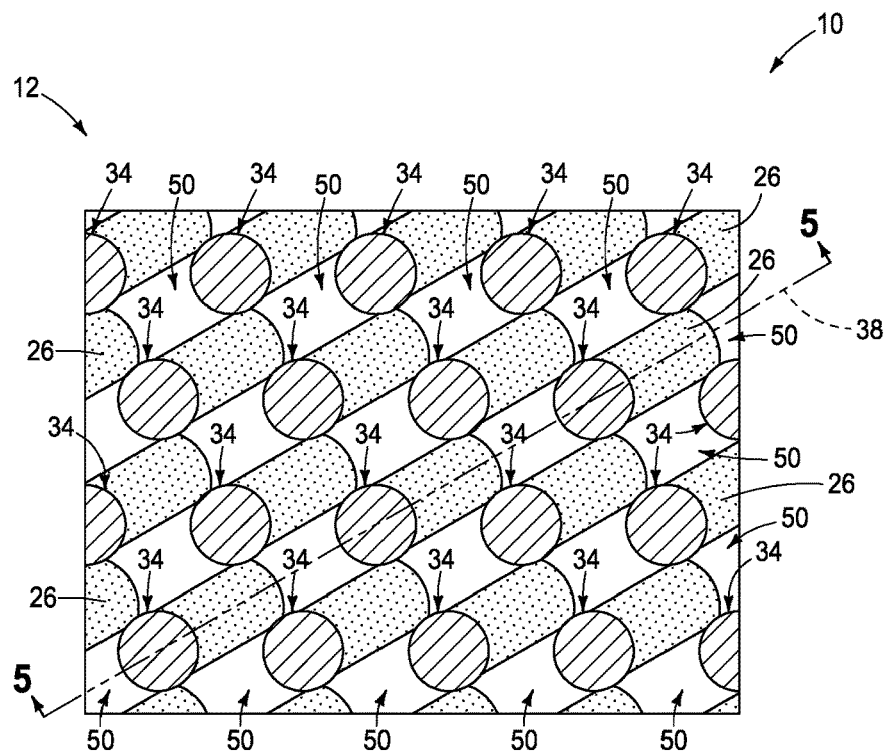
FIGS. 4, 5, and 7-14 are diagrammatic sequential cross-sectional views of the construction of FIG. 1 in process in accordance with some embodiments of the invention.
Figure 5:
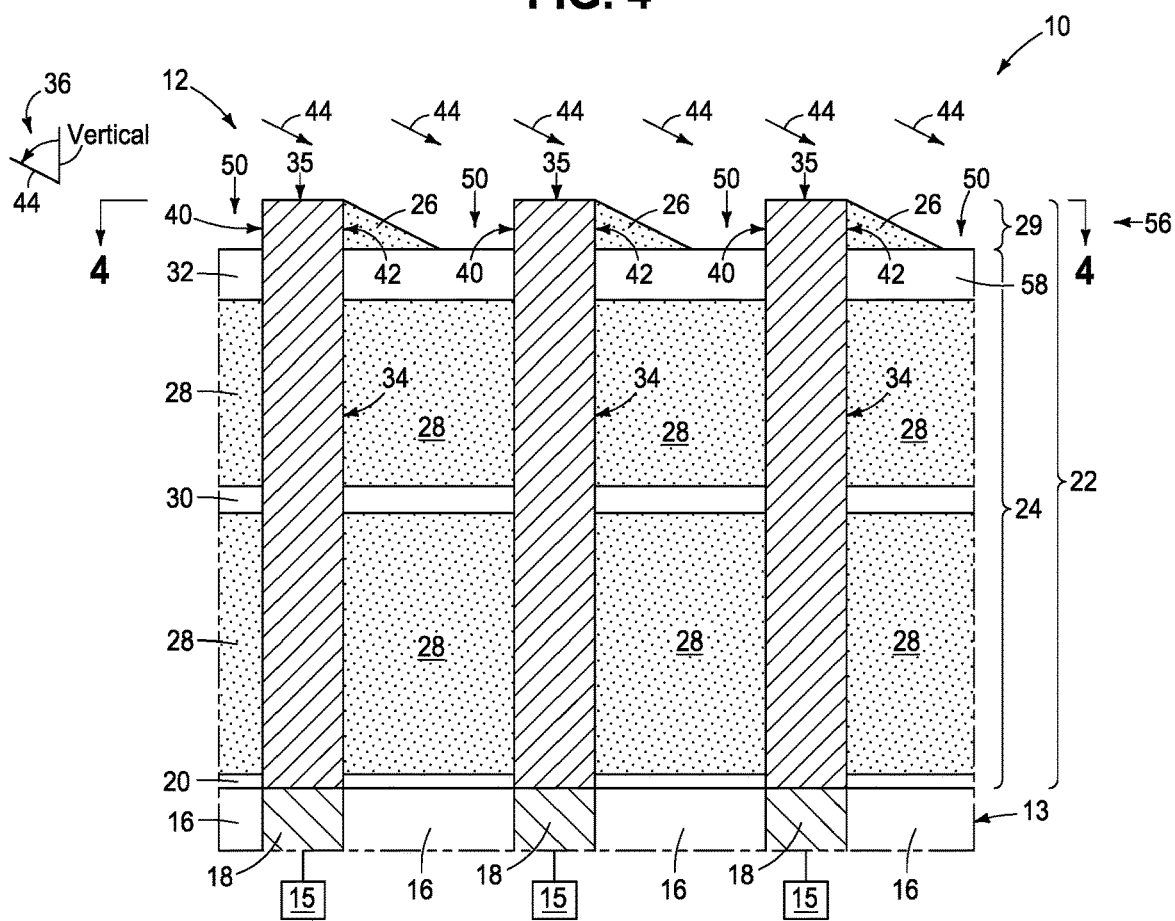

Referring to FIGS. 4 and 5, energy is directed (e.g., as indicated by arrows 44) onto vertically-projecting portions 29 of first capacitor electrodes 34 and onto second material 26 in a direction that is angled from vertical (e.g., angle 36) and that is along straight line 38 between immediately-adjacent first capacitor electrodes 34 to form openings 50 into second material 26 that are individually between immediately-adjacent first capacitor electrodes 34 along straight line 38. In one embodiment and as shown, such directing of energy forms openings 50 through second material 26, and in one such embodiment wherein second material 26 is directly against first material 24, such directing of energy forms openings 50 to first material 24. Alternately, openings 50 in one embodiment may be formed only partially into second material 26 (not shown) at least at this point of the processing. Regardless, in one embodiment and as shown, the total number of openings 50 within array 12 equals the total number of first capacitor electrodes 34 in array 12.

Figure 6:
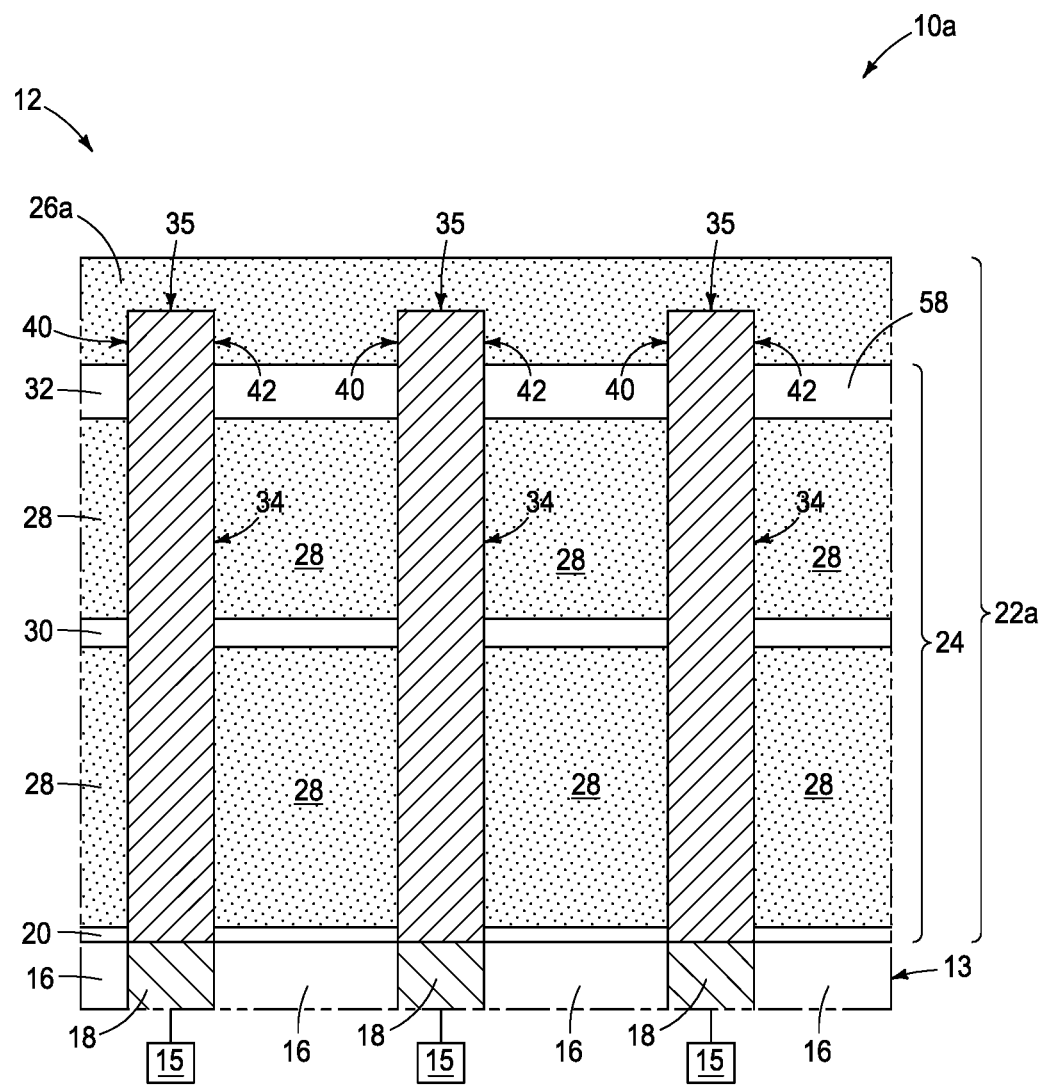
FIG. 6 is a diagrammatic cross-sectional view of a portion of a substrate construction in process in accordance with an embodiment of the invention.
Figure 7:
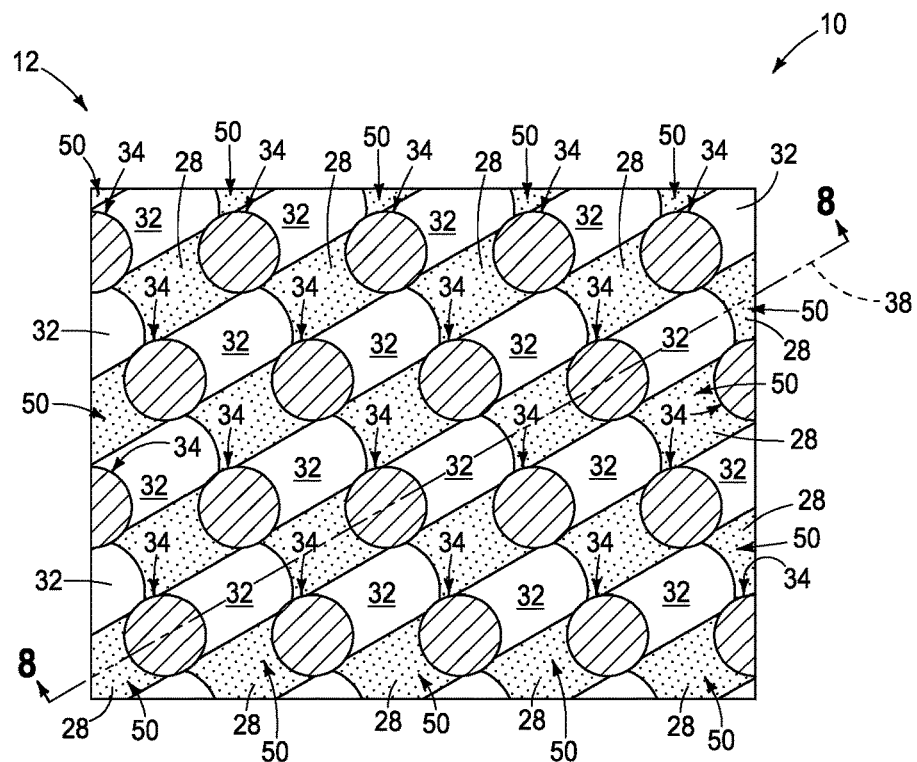
Figure 8:
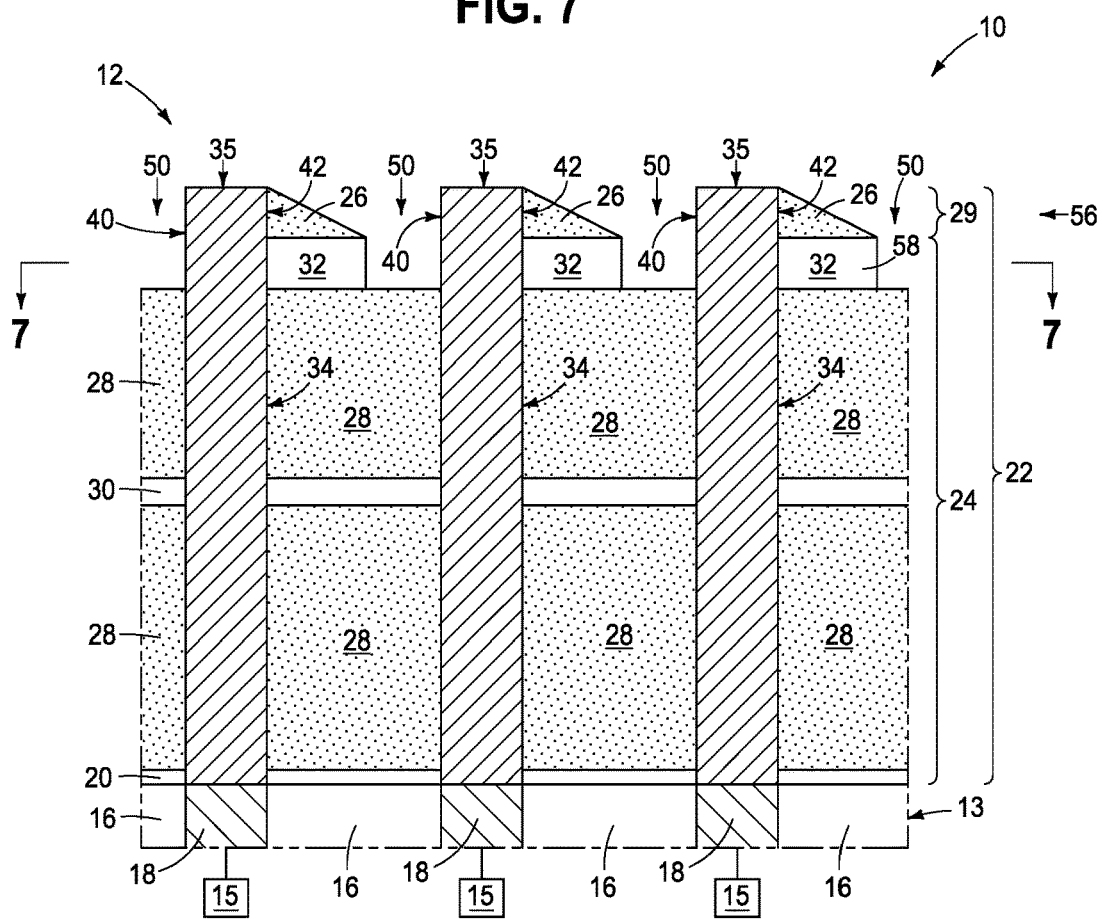

FIGS. 1-5 show an example embodiment wherein second material 26 does not cover vertically-outermost surfaces 35 of first capacitor electrodes 34 at the beginning of said directing of energy onto second material 26 in the direction that is angled from vertical. FIG. 6 shows an alternate example embodiment construction 10a wherein second material 26a of stack 22a is covering vertically-outermost surfaces 35 of first capacitor electrodes 34. Like numerals from the first-described embodiments have been used where appropriate, with some construction differences being indicated with the suffix "a". Accordingly, the directing of energy as shown by FIGS. 4 and 5 with respect to construction 10a of FIG. 6 will initially be onto second material 26a to expose vertically-outermost surfaces 35 of first capacitor electrodes 34. Any other attribute(s) or aspect(s) as shown and/or described herein with respect to other embodiments may be used.

First capacitor electrodes 34 may be considered as an array of structures 34 that are formed elevationally through stack 22 that comprises first material 24 and second material 26. However, embodiments of methods used in forming integrated circuitry may form any other existing or future-developed structures, and whether those structures are sacrificial or remain in a finished circuitry construction and regardless of what material such structures are made of and regardless of whether such structures are circuit-operative in the finished construction of the integrated circuitry. Regardless, in one embodiment and as shown, first capacitor electrodes/structures 34 are arrayed in a two-dimensional (2D) hexagonal lattice. In another embodiment, the structures are arrayed in a two-dimensional (2D) lattice having a parallelogram unit cell, with the direction that is angled from vertical being along a diagonal of the parallelogram unit cell. Other 2D arrays may be used, and which may have a Bravais lattice (i.e., no gaps or overlaps within the lattice) or have a non-Bravais lattice In one embodiment and as shown in FIGS. 4 and 5, the directing of energy removes all of second material 26 from respective first sides 40 of vertically-projecting portions 29 in the vertical cross-section that is along straight line 38 and leaves second material 26 laterally over respective second sides 42 of vertically-projecting portions 29 in the vertical cross-section.

In one embodiment, such directing of energy removes second material 26 to form openings 50 at least predominately (i.e., up to and including 100%) by chemical etching of second material 26 and in one such embodiment which is conducted selectively relative to vertically-projecting portions 29 of first capacitor electrodes/structures 34 (e.g., using a directing chemical etching tool using an etch chemistry to anisotropically etch second material 26 selectively relative to different-composition projecting portions 29 of first capacitor electrodes/structures 34, for example using the Raptor™ and other etching tools available from Applied Materials of Santa Clara, Calif.). In another example, such directing of energy removes second material 26 to form openings 50 at least predominately (i.e., up to and including 100%) by non-chemical physical removal of second material 26, with one such example being using an ion beam etcher that directs a physically bombarding ion beam onto vertically-projecting portions 29 of first capacitor electrodes/structures 34 and onto second material 26 at such angle from vertical. Regardless, the artisan may select any suitable angle from vertical and that may impact size (e.g., maximum length along straight line 38) of openings 50.

In one embodiment, material 32 of first material 24 comprises an insulative support material that supports vertically-elongated first capacitor electrodes/structures 34 in a finished construction. In another example embodiment described below, the second material may comprise an insulative support material in the form of material 32 that provides such function, and which may be in the absence of using any additional second material 26 there-above. Alternately, embodiments of the invention may not use material 32 as an insulative support material that supports vertically-elongated first capacitor electrodes/structures in a finished construction.

In one embodiment and after the directing of energy as described above, at least some of first material 24 is removed to expose sidewalls of first capacitor electrodes/structures 34 (e.g., the majority of which are below material 32). In one such embodiment, the directing of energy has formed second material 26 with openings 50 there-through to be a mask 56 (e.g., second material 26 in combination with material of first capacitor electrodes/structures 34 as designated initially in FIG. 5). In one such embodiment, and referring to FIGS. 7 and 8, mask 56 has been used while etching insulative support material 32 through openings 50 in mask 56 to extend openings 50 into and through insulative support material 32.

Figure 9:
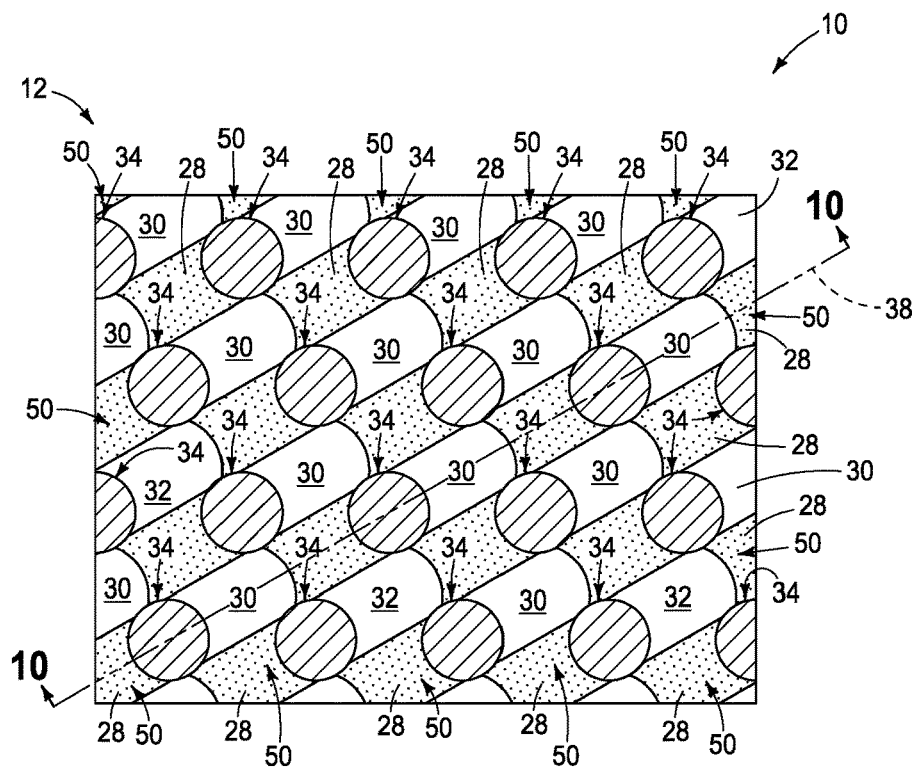
Figure 10:
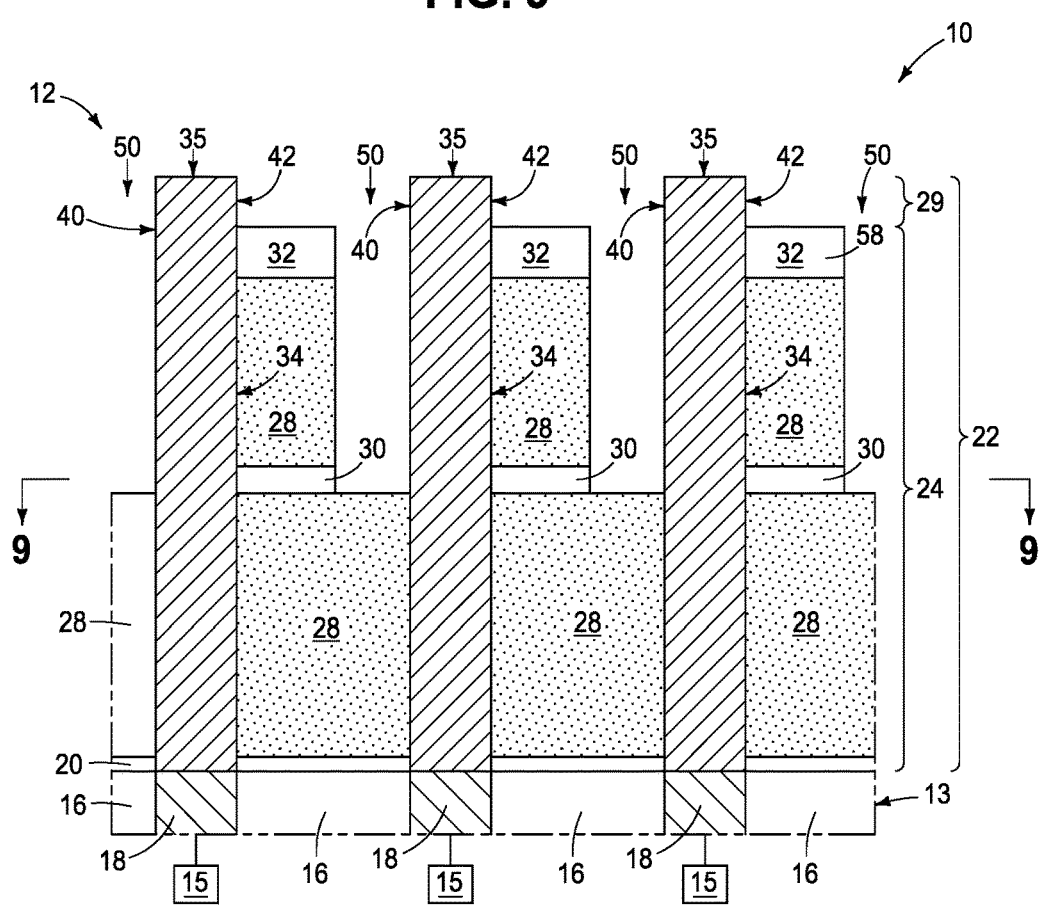

In one such embodiment, and referring to FIGS. 9 and 10, the removing of at least some of first material 24 to expose sidewalls of first capacitor electrodes/structures 34 comprises etching first material 24 that is below insulative support material 32 (e.g., material 28) selectively relative to insulative-support material 32 and first capacitor electrodes/structures 34. Such may be conducted isotropically or anisotropically. Additionally, and as shown, such might ideally be conducted initially anisotropically to intermediate material 30, and then chemistry changed to etch anisotropically through intermediate material 30. Where second material 26 (not shown) is of the same composition as that of material 28, such etching may remove all remaining second material 26 as shown. Regardless, and in one embodiment, all remaining second material 26 when sacrificial is removed.

In one embodiment, second material 26 initially comprises a horizontal layer 58 that is horizontally and vertically continuous within array 12 (FIG. 2). In one such embodiment, such horizontal layer 58 is formed to be horizontally and vertically discontinuous by or after said directing of energy, with the example embodiments of FIGS. 1-5, 7, and 8 showing the act of directing such energy forming such horizontal layer 58 to be horizontally and vertically discontinuous in FIGS. 7-10.

Figure 11:
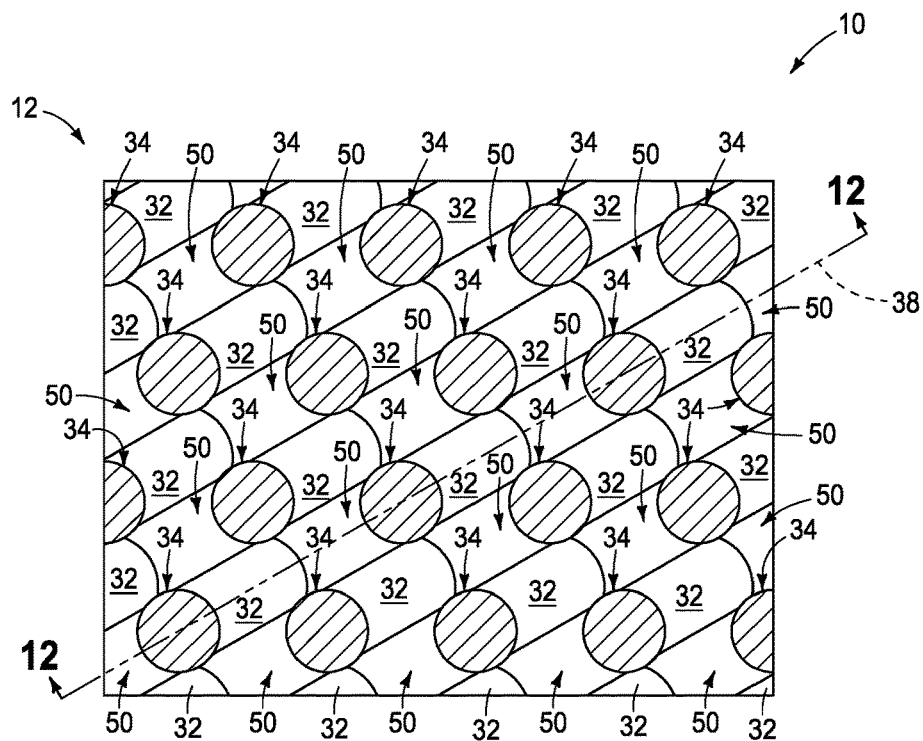
Figure 12:
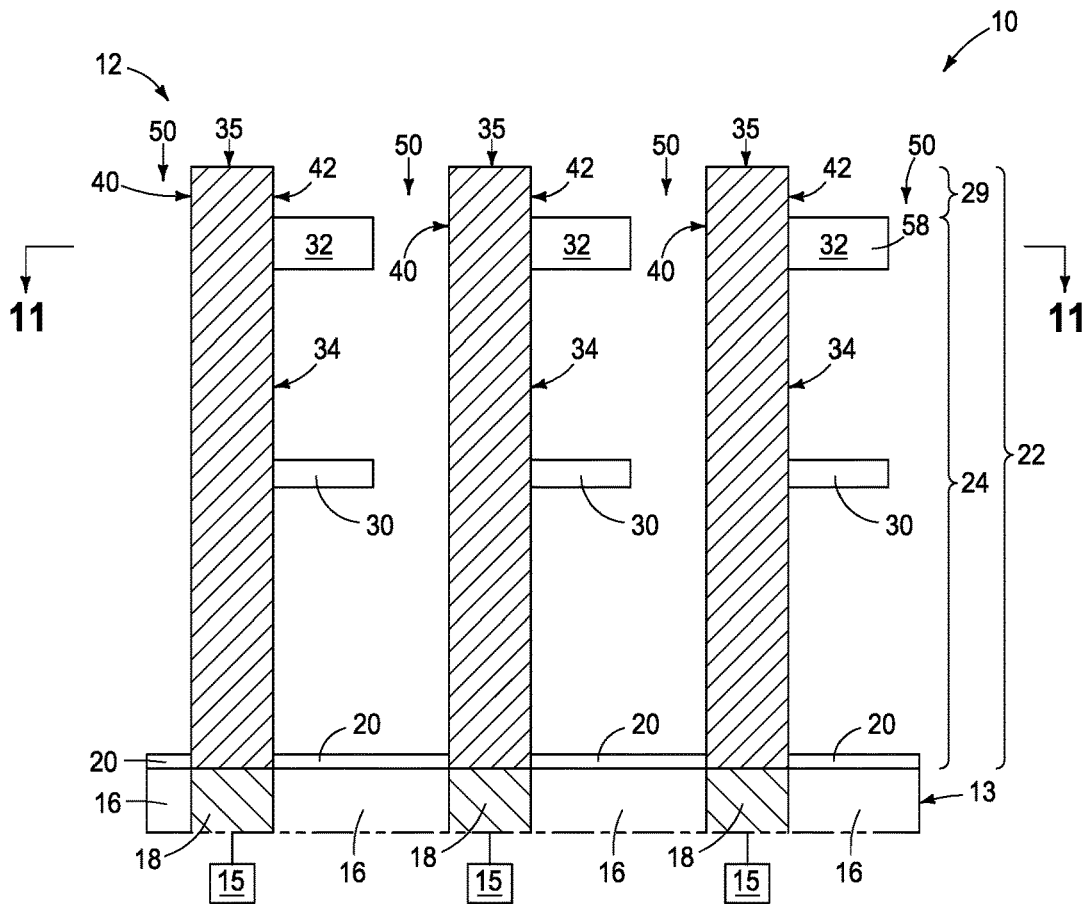

FIGS. 11 and 12 show example subsequent processing wherein isotropic etching has been conducted to remove all remaining material 28 (not shown) to expose more of the sidewalk of first capacitor electrodes/structures 34. Intermediate material 30 when present may also function as an insulative support material that supports vertically-elongated first capacitor electrodes/structures 34 in a finished construction.

Figure 13:
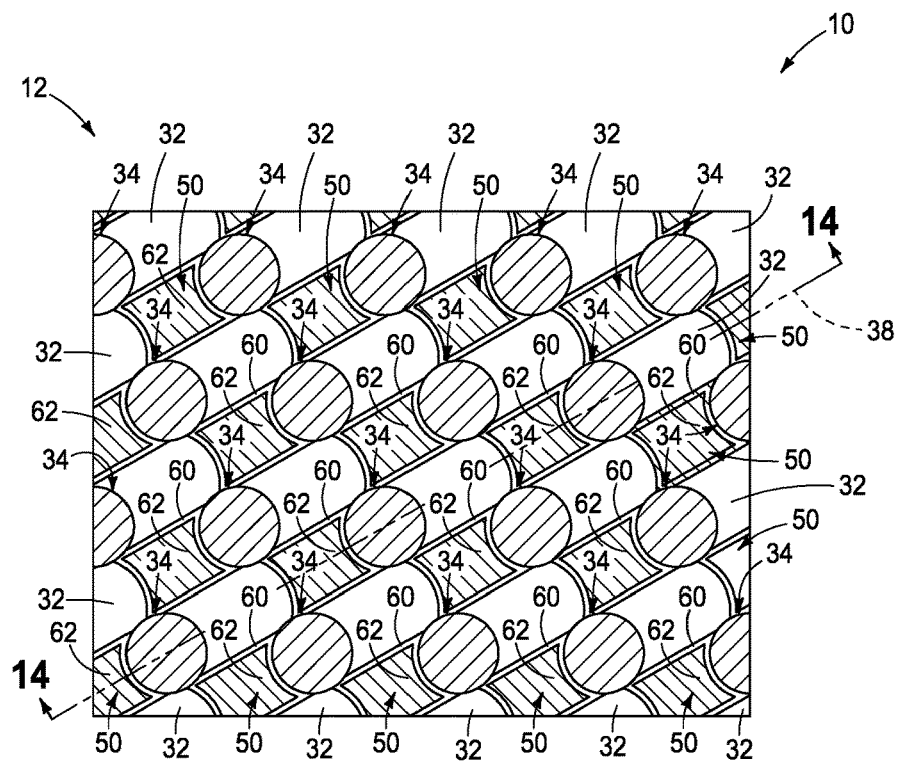
Figure 14:
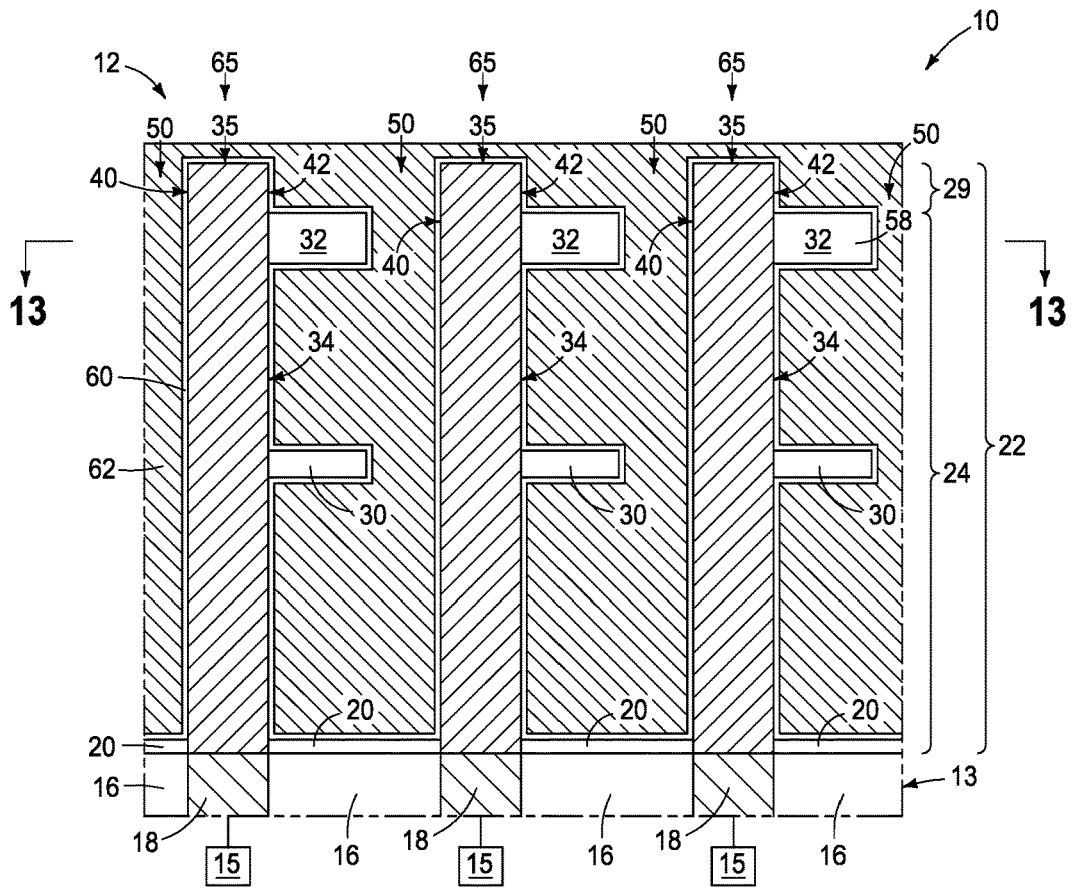

Referring to FIGS. 13 and 14, a capacitor insulator 60 has been formed over the exposed sidewalls of first capacitor electrodes/structures 34 (and over insulative support materials 32 and 30 when present) and at least one second capacitor electrode 62 has been formed over capacitor insulator 60, thus forming individual capacitors 65. In one embodiment and as shown, a single second capacitor electrode 62 may be formed that is common to all capacitors 65 within array 12.

Any other attribute(s) or aspect(s) as shown and/or described herein with respect to other embodiments may be used.

Figure 15:
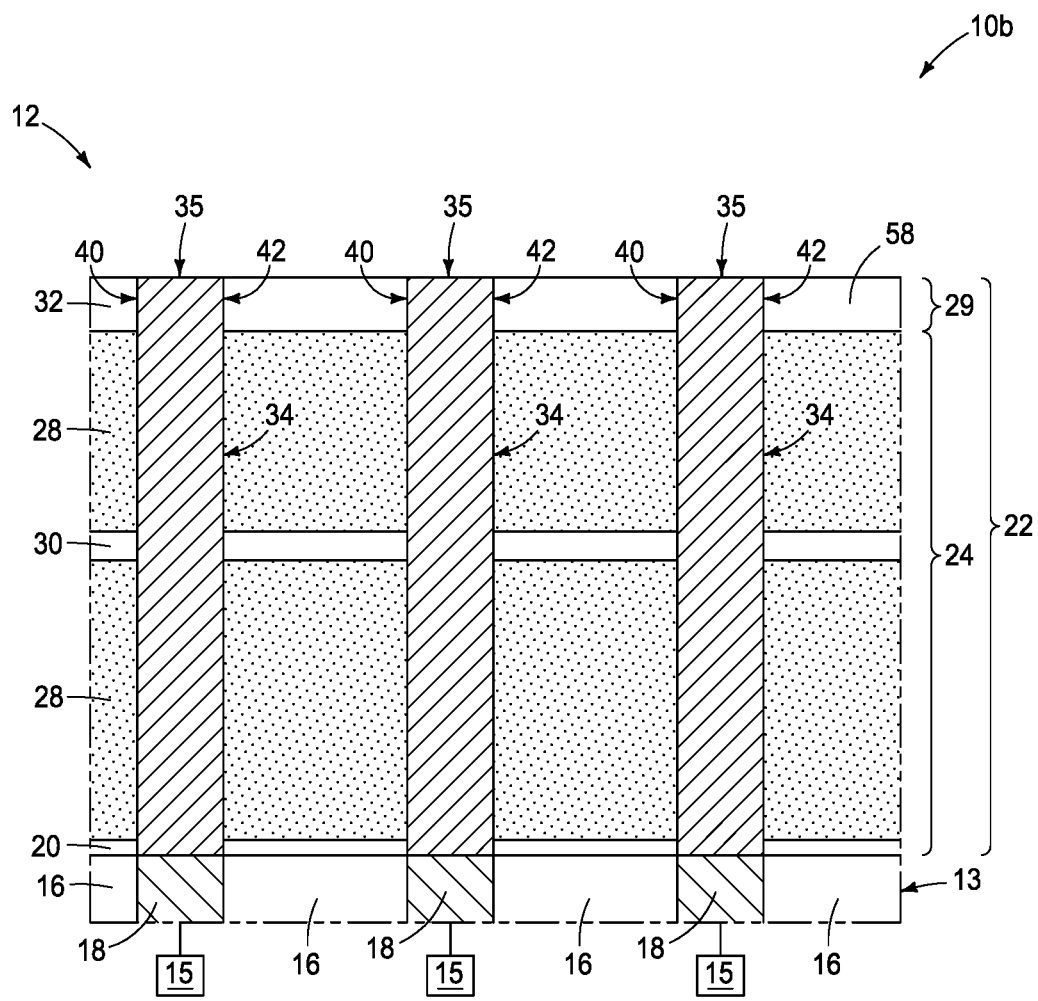
FIG. 15 is a diagrammatic cross-sectional view of a portion of a substrate construction in process in accordance with an embodiment of the invention.
Figure 16:
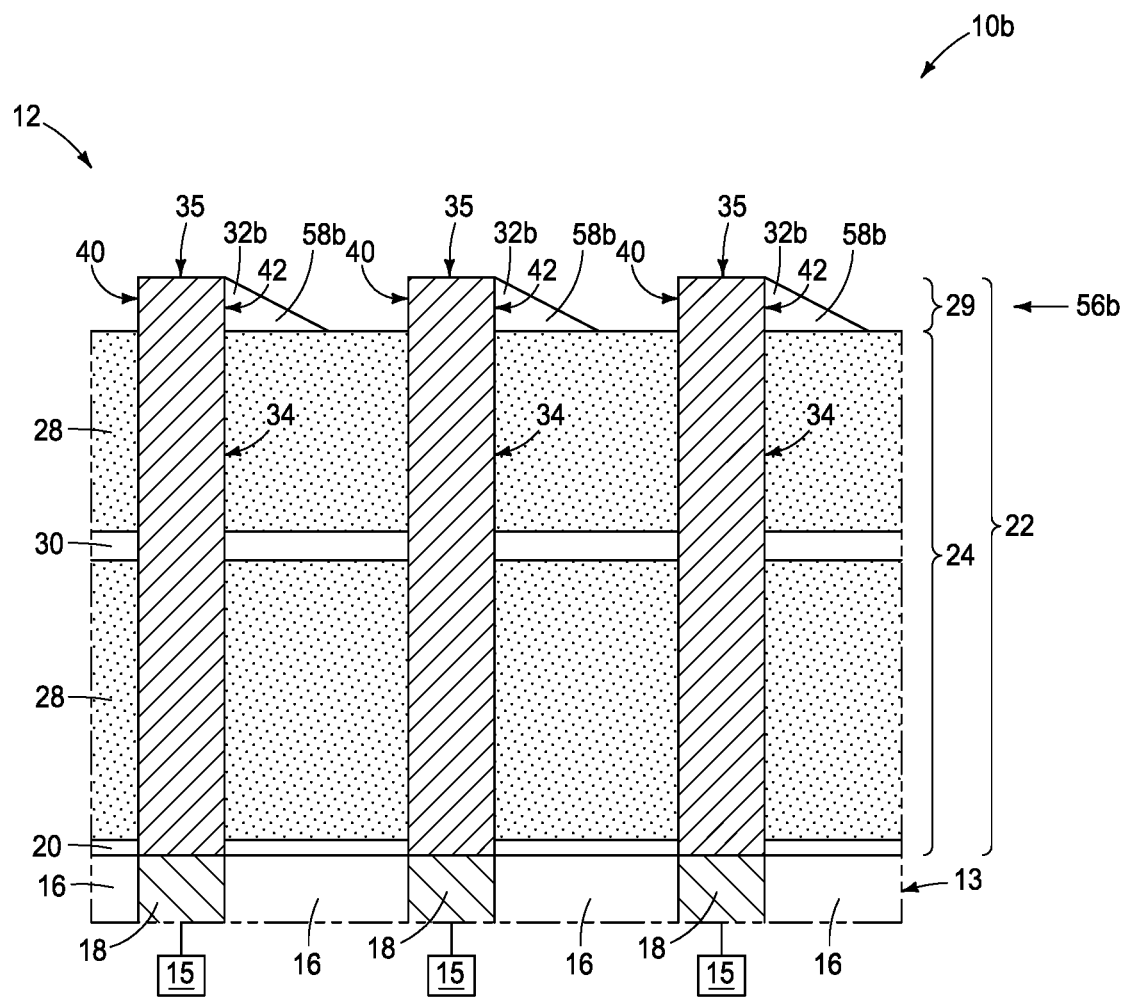
FIG. 16 is a view of the FIG. 15 construction at a processing step subsequent to that shown by FIG. 15.

An example alternate embodiment is described with respect to FIGS. 15 and 16 with respect to fabrication of an alternate embodiment construction 10b. Like numerals from the above-described embodiment have been used where appropriate, with some construction differences being indicated with the suffix "b". The alternate example method embodiment does not use example second material 26 of the first-described embodiments vertically outward of material 32. Rather, in FIGS. 15 and 16, first material 24 may be considered as all material below material 32, with material 32 being considered as the second material and that in one embodiment is directly against the sidewalls of first capacitor electrodes/structures 34 and in one embodiment with material 32 being insulative and supporting first capacitor electrodes 34 in a finished construction of an array of capacitors. FIG. 15 corresponds in processing sequence to that of FIG. 3 (prior to the directing of energy at the angle from vertical) and FIG. 16 corresponds in processing sequence to that of FIG. 5 (after the directing of energy at the angle from vertical). FIG. 16 shows material 32b of horizontal layer 58b forming a mask 56b. Subsequent processing may occur as described above with respect to FIGS. 7-14. Any other attribute(s) or aspect(s) as shown and/or described herein with respect to other embodiments may be used.

Embodiments of the invention encompass an array of capacitors independent of method of manufacture. Nevertheless, such an array may have any of the attributes as described herein in method embodiments. Likewise, the above-described method embodiments may incorporate and form any of the attributes described with respect to device embodiments.

In one embodiment, an array of capacitors (e.g., 65) comprises a two-dimensional (2D) array (e.g., 12) of vertically-elongated first capacitor electrodes (e.g., 34). A horizontal layer (e.g., 58, 58b) of insulative support material (e.g., 32) is directly against and supports the first capacitor electrodes. The horizontal layer of the insulative support material is horizontally and vertically discontinuous in the two dimensions in the 2D array (e.g., contrary to capacitor insulator 60 that is horizontally and vertically continuous). A capacitor insulator (e.g., 60) is directly against the horizontally and vertically discontinuous horizontal layer of the insulative support material and is directly against the vertically-elongated first capacitor electrodes. At least one second capacitor electrode (e.g., 62) is directly against the capacitor insulator. Any other attribute(s) or aspect(s) as shown and/or described herein with respect to other embodiments may be used.

In one embodiment, an array of capacitors (e.g., 65) comprises a 2D array (e.g., 12) of vertically-elongated first capacitor electrodes (e.g., 34). An uppermost horizontal layer (e.g., 58, 58b) of insulative support material (e.g., 32) is directly against and supports the first capacitor electrodes. Openings (e.g., 50) extend vertically through the uppermost horizontal layer of the insulative support material in the 2D array. The openings have total number within the array that equals total number of the vertically-elongated first capacitor electrodes in the 2D array. A capacitor insulator (e.g., 60) is directly against the uppermost horizontal layer of the insulative support material and is directly against the vertically-elongated first capacitor electrodes. At least one second capacitor electrode (e.g., 62) is directly against the capacitor insulator. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be devotionally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming an array of structures elevationally through a stack comprising first and second materials. The structures project vertically relative to an outermost portion of the first material. Energy is directed onto vertically-projecting portions of the structures and onto the second material in a direction that is angled from vertical and that is along a straight line between immediately-adjacent of the structures to form openings into the second material that are individually between the immediately-adjacent structures along the straight line.

In some embodiments, a method used in forming an array of capacitors comprise forming an array of vertically-elongated first capacitor electrodes through a stack comprising first and second materials. The first capacitor electrodes project vertically relative to an outermost portion of the first material. Energy is directed onto vertically-projecting portions of the first capacitor electrodes and onto the second material in a direction that is angled from vertical and that is along a straight line between immediately-adjacent of the first capacitor electrodes to form openings through the second material that are individually between the immediately-adjacent first capacitor electrodes along the straight line. Said directing of energy removes all of the second material from respective first sides of the vertically-projecting portions in a vertical cross-section that is along the straight line. Said directing of energy leaves the second material laterally over respective second sides of the vertically projecting portions in the vertical cross-section. After said directing of energy, at least some of the first material is removed to expose sidewalls of the first capacitor electrodes. A capacitor insulator is formed over the exposed sidewalk of the first capacitor electrodes. At least one second capacitor electrode is formed over the capacitor insulator.

In some embodiments, an array of capacitors comprises a two-dimensional (2D) array of vertically-elongated first capacitor electrodes. A horizontal layer of insulative support material is directly against and supports the first capacitor electrodes. The horizontal layer of the insulative support material is horizontally and vertically discontinuous in the two dimensions in the 2D array. A capacitor insulator is directly against the horizontally and vertically discontinuous horizontal layer of the insulative support material and is directly against the vertically-elongated first capacitor electrodes. At least one second capacitor electrode is directly against the capacitor insulator.

In some embodiments, an array of capacitors comprises a two-dimensional (2D) array of vertically-elongated first capacitor electrodes. An uppermost horizontal layer of insulative support material is directly against and supports the first capacitor electrodes. Openings extend vertically through the uppermost horizontal layer of the insulative support material in the 2D array. The openings have total number within the array that equals total number of the vertically-elongated first capacitor electrodes in the 2D array. A capacitor insulator is directly against the uppermost horizontal layer of the insulative support material and is directly against the vertically-elongated first capacitor electrodes. At least one second capacitor electrode is directly against the capacitor insulator.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an array of capacitors, comprising:
    forming an array of vertically-elongated first capacitor electrodes through a stack comprising first and second materials, the first capacitor electrodes projecting vertically relative to an outermost portion of the first material;
    directing energy onto vertically-projecting portions of the first capacitor electrodes and onto the second material in a direction that is angled from vertical and that is along a straight line between immediately-adjacent of the first capacitor electrodes to form openings through the second material that are individually between the immediately-adjacent first capacitor electrodes along the straight line, said directing of energy removing all of the second material from respective first sides of the vertically-projecting portions in a vertical cross-section that is along the straight line, said directing of energy leaving the second material laterally over respective second sides of the vertically projecting portions in the vertical cross-section;
    after said directing of energy, removing at least some of the first material to expose sidewalls of the first capacitor electrodes;
    forming a capacitor insulator over the exposed sidewalls of the first capacitor electrodes; and
    forming at least one second capacitor electrode over the capacitor insulator.

2. The method of claim 1 wherein the first material comprises an insulative support material that supports the vertically-elongated first capacitor electrodes in a finished construction of the array of capacitors, the second material with openings there-through forms a mask, and further comprising:
    using the mask while etching the insulative support material through the openings in the mask to extend said openings into and through the insulative support material.

3. The method of claim 1 wherein,
    the second material comprises insulative support material that is directly against sidewalls of the vertically-elongated first capacitor electrodes and supports the vertically-elongated first capacitor electrodes in a finished construction of the array of capacitors; and the openings are ultimately formed through the insulative-support-second material to the first material.

4. The method of claim 3 wherein the removing at least some of the first material to expose sidewalls of the first capacitor electrodes comprises etching the first material through the openings selectively relative to the insulative-support-second material and the vertically-elongated first capacitor electrodes.

5. The method of claim 1 wherein the second material is sacrificial and is removed prior to forming the capacitor insulator.

6. The method of claim 5 wherein the first material comprises an insulative support material that supports the vertically-elongated first capacitor electrodes in a finished construction of the array of capacitors.

7. The method of claim 6 wherein the second material with openings there-through forms a mask, and further comprising:

using the mask while etching the insulative support material through the openings in the mask to extend said openings into and through the insulative support material.

8. The method of claim 7 wherein the removing at least some of the first material to expose sidewalls of the first capacitor electrodes comprises etching the first material through the openings in the insulative-support material selectively relative to the insulative-support-second material and the vertically-elongated first capacitor electrodes.

9. A method used in forming integrated circuitry, comprising:

forming an array of structures elevationally through a stack comprising first and second materials, the structures projecting vertically relative to an outermost portion of the first material; and directing energy onto vertically-projecting portions of the structures and onto the second material in a direction that is angled from vertical and that is along a straight line between immediately-adjacent of the structures to form openings into the second material that are individually between the immediately-adjacent structures along the straight line.

10. The method of claim 9 wherein the second material does not cover vertically-outermost surfaces of the structures at beginning said directing of energy onto the second material in the direction that is angled from vertical.

11. The method of claim 9 wherein, the second material covers vertically-outermost surfaces of the structures; and said directing of energy initially being onto the second material to expose vertically-outermost surfaces of the structures.

12. The method of claim 9 wherein the openings have total number that equals total number of said structures.

13. The method of claim 9 wherein the structures are arrayed in a two-dimensional (2D) hexagonal lattice.

14. The method of claim 9 wherein the structures are arrayed in a two-dimensional (2D) lattice having a parallelogram unit cell, the direction being along a diagonal of the parallelogram unit cell.

15. The method of claim 9 wherein said directing of energy forms the openings through the second material.

16. The method of claim 15 wherein the second material is directly against the first material, said directing of energy forming the openings to the first material.

17. The method of claim 9 wherein said directing of energy removes the second material to form the openings at least predominantly by chemical etching of the second material.

18. The method of claim 17 wherein said chemical etching is conducted selectively relative to the vertically-projecting projections.

19. The method of claim 9 wherein said directing of energy removes the second material to form the openings at least predominantly by non-chemical physical removal of the second material.

20. The method of claim 19 wherein said directing of energy comprises directing an ion beam onto the vertically-projecting portions of the structures and onto the second material at said angle.

21. The method of claim 9 wherein, the second material initially comprises a horizontal layer that is horizontally and vertically continuous within the array; and forming the horizontal layer to be horizontally and vertically discontinuous by or after said directing of energy.

22. The method of claim 21 wherein the openings have total number that equals total number of said structures.

* * * * *